(12) United States Patent
Kim (10) Patent No.: US 7,715,246 B1
(45) Date of Patent: May 11, 2010

(54) MASK ROM WITH LIGHT BIT LINE ARCHITECTURE

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 189 days.

(21) Appl. No.: 12/163,975

(22) Filed: Jun. 27, 2008

(51) Int. Cl.
*G11C 7/00* (2006.01)

(52) U.S. Cl. .................. 365/189.14; 365/195; 365/203; 365/189.05

(58) Field of Classification Search ............ 365/189.14, 365/195, 203, 189.05
See application file for complete search history.

(56) References Cited

U.S. PATENT DOCUMENTS

| | | |
|---|---|---|
| 5,148,063 A | 9/1992 | Hotta |
| 5,406,511 A * | 4/1995 | Nogami ................. 365/149 |
| 5,815,450 A | 9/1998 | Kimura |
| 6,504,789 B2 | 1/2003 | Hirakawa |

\* cited by examiner

*Primary Examiner*—Son Dinh
*Assistant Examiner*—Nam Nguyen (57) ABSTRACT

For improving performance of mask ROM, bit line is multi-divided for reducing capacitance, so that multi-stage sense amps are used for reading, wherein a local sense amp receives an output from a memory cell through the bit line, and a global sense amp receives the local sense amp output. By the sense amps, a voltage difference in the bit line is converted to a time difference for differentiating data "1" and data "0". For example, data "1" is quickly transferred to an output latch circuit through the sense amps with high gain, but data "0" is rejected by a locking signal based on data "1" as a reference signal. Furthermore, a buffered data path is used for transferring data wherein the buffered data path includes a forwarding write line and a returning read line. Additionally, alternative circuits and memory cell structures for implementing the mask ROM are described.

20 Claims, 8 Drawing Sheets

FIG. 7A (6F² Cell)

MASK ROM WITH LIGHT BIT LINE ARCHITECTURE

FIELD OF THE INVENTION

The present invention relates to a semiconductor memory device, and more particularly, to a mask ROM (Read Only Memory) with light bit line architecture.

BACKGROUND OF THE INVENTION

Mask ROM is a kind of ROM (Read Only Memory) which is usually used only for reading data and is characteristically a non-volatile memory which holds contents of data even after the power is shut down. In addition, having a simple structure and high integrity, it is suitable for mass-production and cost-effective. The mask ROM is designed to provide a circuit on a semiconductor wafer using a mask on which a stored data is formed during a manufacturing process in accordance with a program indicating a user's request. Thus, data written on the mask ROM cannot be changed after fabrication.

To write data on the mask ROM, there are proposed a method of causing a short-circuit between the source and drain of a memory cell by using a diffusion layer or ion implantation, and a method of electrically cutting connection by using a contact hole needed to connect a cell with a bit line or metal wiring layer.

Figure 1:
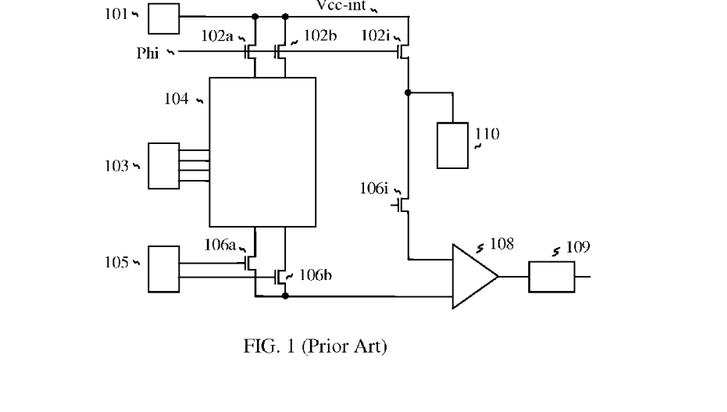
FIG. 1 illustrates a prior art for mask ROM.

In FIG. 1, one of prior arts is illustrated, as published, U.S. Pat. No. 5,815,450 wherein the mask ROM comprises a low voltage circuit 101 supplying a dropped voltage, pre-charge transistors 102a to 102h, a row decoder 103, a memory cell array 104, a column decoder 105 selection transistors 106a, 106b and 106i for selecting respective bit lines of the memory cell array 104, a reference cell 110, a sense amplifier 108 and an output buffer 109. The drains of the pre-charge transistors 102a, 102b and 102i are connected in common to the output of the low voltage circuit 101 and the sources are coupled with respective bit lines of the memory cell array 104 while a pre-charge pulse Phi is input to the gates.

Further, of the selection transistors 106a to 106b, the drains are coupled with the respective bit lines of the memory cell array 104 and the sources are connected in common to one input terminal of the sense amplifier 108 while the gates are linked to respective selection signal lines of the column decoder 105. And a reference voltage is generated by the reference cell 110, and which is one of inputs of the sense amplifier 108.

A dropped voltage Vcc-int output from the low voltage circuit 101 is applied to the bit lines of the memory cell array 104 via the pre-charge transistors 102a, 102b and 102i. That is, the pre-charge transistors 102a, 102b and 102i are turned on by the pre-charge pulse Phi produced by detecting the change of an input signal, such as, an address signal or a control signal so as to pre-charge the bit lines to the predetermined level of the voltage Vcc-int. The level of Vcc-int is preferably determined to approximately 2V considering the problem of reliability of the memory cells and the like.

Then, after the pre-charge, one word line is selected by the row decoder 103 and one of the selection transistors 106a and 106b is selected by the column decoder 105, thus selecting one bit line to be connected to the sense amplifier 108. Next, the sense amplifier 108 is activated, and which compares a voltage from a main memory cell and a reference voltage from the reference cell with the level of the selected bit line to read out the data written in the memory cell. The read-out data are fed to the output buffer 109. However, one drawback is that it is difficult to repair some failed memory cells with redundant cells, because the mask ROM cannot be changed after fabrication. Thereby, laser fuse and electric fuse can be used as the redundant memory cells for the repair after fabrication. However, the laser fuse and electric fuse are big and access path is different from the mask ROM cells.

Furthermore, the bit line is heavily loaded with conventional sensing scheme which includes differential amplifier, so that charging time of the bit line is slow, which is one of obstacles for achieving fast read operation.

In this respect, there is still a need for improving the mask ROM, in order to increase density and also improve speed. In the present invention, mask ROM includes a capacitor as a storage element for programming with an additional contact mask, so that the memory cell and peripheral circuit are same as OTP (one time programmable memory) as redundant memory cells, except programming method. Thereby, failed mask ROM cells are replaced with the OTP cells for repairing, and which reduces area and achieves same access path after programming, while the mask ROM is programmed during process. As a result, the mask ROM is more useful for high volume production because there is no extra programming time for the main memory cells, even though the density of the memory is increased.

Furthermore, when reading, light bit line architecture is applied by dividing long bit line for reducing parasitic capacitance, so that multi-stage sense amps are used for reading the divided bit lines with a time domain sensing scheme, in order to compare the output from the memory cell, where a reference signal is generated by one of fast changing data with high gain from reference cells, which signal serves as a reference signal to generate a locking signal or a read duration control signal, in order to compare high voltage data (blown) and low voltage data (not blown), because one of data from the memory cell (fast data) is reached to a global sense amp through local sense amp with high gain while another data (slow data) is rejected by the reference signal based on data "1". With light bit line architecture, the local bit line is quickly charged of discharged, so that high speed operation is realized.

The memory cell can be formed on the surface of the wafer. And the steps in the process flow should be compatible within the current CMOS manufacturing environment. Alternatively, the memory cell can be formed from thin film polysilicon layer, because the lightly loaded bit line can be quickly discharged by the memory cell even though the thin film pass transistor can flow relatively low current. In doing so, multi-stacked memory is realized with thin film transistor, which can increase the density within the conventional CMOS process with additional process steps, because the conventional CMOS process is reached to a scaling limit for fabricating transistors on a surface of a wafer. In addition, a body-tied TFT (Thin Film Transistor) transistor can be used as the thin film transistor for alleviating self heating problem of short channel TFT.

SUMMARY OF THE INVENTION

In the present invention, a mask ROM with light bit line architecture is realized, wherein the mask ROM includes a capacitor as a storage element for programming with an additional contact mask during fabrication, so that the mask ROM is combined with OTP (one time programmable) memory including the same capacitor as a storage element which is programmed by breaking down after fabrication. Thereby, the OTP memory cells are used as redundant cells for repairing the mask ROM as main memory cells, and which achieves same access path with same process steps and same peripheral circuits. As a result, the mask ROM is useful for high volume product because there is no extra programming time for the main memory cells, while some failed main cells are replaced with the OTP memory cells on a same chip after fabrication.

For realizing high speed memory, light bit line architecture is realized wherein bit lines are multi-divided into short local bit lines to reduce parasitic loading. Thus the local bit line is lightly loaded. In doing so, the light bit line is quickly charged or discharged when reading, which realizes fast read operation. When reading, a stored data in a memory cell is transferred to an output latch circuit through multi-stage sense amps such that data "1" is transferred to the output latch circuit with high gain, but low data is not transferred with low gain.

Furthermore, a buffered data path is used for accessing the memory cells, wherein a forwarding write line serving as a forwarding data path is used for writing (the OTP memory cell for repair), such that the forwarding write line is selected by a block select signal, which realizes to reduce driving current and RC time constant, because unselected portion of the data line is not charging or discharging when writing. Furthermore, unselected portion of the data path is used as a read data path which is a returning read line serving as a returning read path. Thus, the returning read line receives a read output from a memory cell through multi-stage sense amps. And the returning read path is also buffered and connected to data output node through multiple buffers. With the returning read path, access time is almost same regardless of selected memory cell location, which realizes to latch the read output at a time with enough set-up and hold time even though a latch clock is fixed.

Furthermore, configuring memory is more flexible, such that multiple memory macros can be configured with small segmented memory array and multi-stage sense amps, instead of big macro with the conventional sense amps. And number of sense amps can be determined by the target speed. For example, high speed application needs more segmented array with more sense amps, while high density application needs more memory cells with reduced number of sense amps, thus cell efficiency is increased.

Furthermore, the local sense amp has high gain with wider channel MOS transistor than that of the memory cell, and the segment sense amp has higher gain than that of the local sense amp. For instance, a wider channel MOS transistor can be used as a segment amplify transistor for the segment sense amp, which realizes fast read operation.

By the sense amps, a voltage difference in the local bit line is converted to a time difference as an output of the global sense amp with gain of the sense amps. In this manner, a time-domain sensing scheme is realized to differentiate data "1" and data "0" stored in the memory cell. For instance, data "1" is quickly transferred to an output latch circuit through the sense amps with high gain, but data "0" is rejected by a locking signal based on data "1" as a reference signal.

More specifically, a reference signal is generated by one of fast changing data with high gain from reference cells, which signal serves as a reference signal to generate a locking signal or a read duration control signal in order to reject latching another data which is slowly changed with low gain, such that high voltage data is arrived first while low voltage data is arrived later, or low voltage data is arrived first while high voltage data is arrived later depending on configuration. The time domain sensing scheme effectively differentiates high voltage data and low voltage data with time delay control, while the conventional sensing scheme is current-domain or voltage-domain sensing scheme. In the convention memory, the selected memory cell discharges the local bit line, and the discharged voltage of the local bit line is compared by a comparator which determines an output at a time. There are many advantages to realize the time domain sensing scheme, so that the sensing time is easily controlled by a tunable delay circuit, which compensates cell-to-cell variation and wafer-to-wafer variation, such that there is a need for adding a delay time before locking the latch circuit with a statistical data for all the memory cells, such as mean time between fast data and slow data. Thereby the tunable delay circuit generates a delay time for optimum range. And the read output from the memory cell is transferred to the latch circuit through a returning read path, thus the access time is equal regardless of the location of the selected memory cell, which is advantageous to transfer the read output to the external pad at a time.

Furthermore, the memory cell can be reduced because the memory cell only drives a lightly loaded local bit line when reading, and also the current flow of the pass transistor can be reduced, which means that the memory cell can be miniaturized further. Moreover, the present invention realizes multi-stacked memory cell structure including thin film transistor because the memory cell only drives lightly loaded bit line even though thin film polysilicon transistor can flow lower current, around 10 times lower, for example.

Furthermore, various alternative configurations are described for implementing the multi-stage sense amps. Furthermore, example memory cell layout and cross sectional views are illustrated to minimize cell area. And the fabrication method is compatible with the conventional CMOS process for realizing planar memory cell including the single-crystal-based regular transistor. And alternatively, additional steps are required for using thin film polysilicon transistor as a pass transistor of the memory cell. And the memory cell can be formed from various semiconductor materials, such as silicon-germanium and germanium.

Still, furthermore, various capacitors can be used as the capacitor storage element. For example, gate capacitor, PIP (Polysilicon Insulator Polysilicon) capacitor and MIM (Metal Insulator Metal) capacitor can be used for forming the capacitor.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 2A:
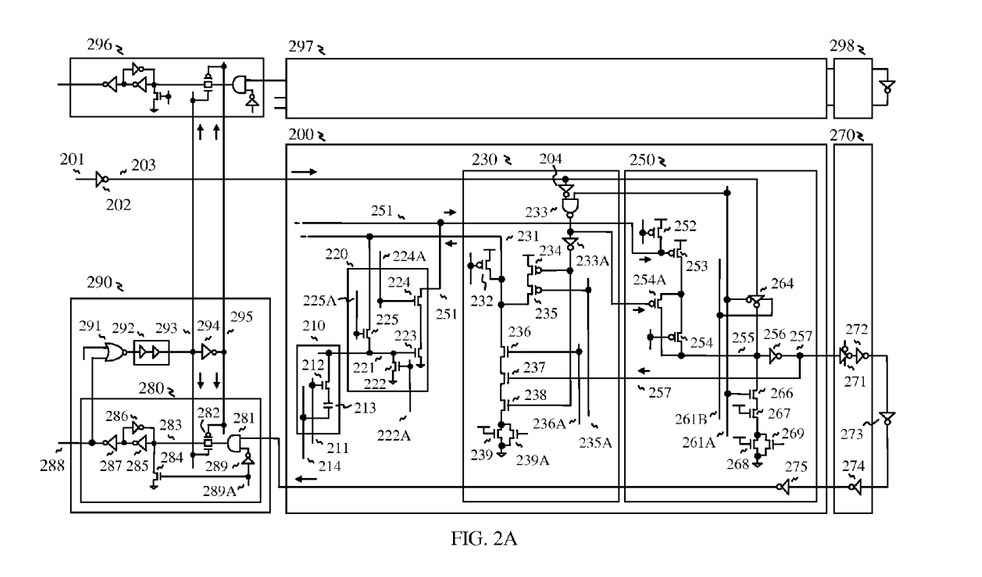
FIG. 2A illustrates a mask ROM with light bit line architecture.

The present invention is directed to a mask ROM with light bit line architecture, as shown in FIG. 2A, wherein a memory block 200 comprises a memory cell 210, a local sense amp 220, a write (program) circuit 230, and a read (sense) circuit 250, where the memory cell 210 and the local sense amp 220 configure a memory segment. The write circuit 230 and the read circuit 250 configure a global sense amp. A word line 211 and a plate line 214 is connected to the memory cell 210 which includes a pass transistor 212 and a capacitor 213, where the capacitor 213 is shorted to the plate line 214 by additional contact mask for programming the mask ROM. Otherwise, the capacitor 213 is floating when un-programmed. And the memory cell 210 is connected to the local sense amp through a local bit line 221 for reading data. Furthermore, the capacitor 213 is used as a one time programmable memory for redundant memory cells as well, such that a write bit line 231 is connected to the memory cell 210 for writing data, where the capacitor is blown for storing data "1", otherwise the capacitor is not blown for storing data "0". In doing so, the combination of mask ROM as main memory cell and OTP memory as redundant memory cell is useful to fabricate high volume read-only memory, while only OTP memory is useful for low volume product or a beginning stage product for high volume product, because programming all memory cells takes time when density is increased. More detailed memory cell structure as the mask ROM and the OTP memory will be illustrated as below.

An advantage using the capacitor as a storage element is that the programming time is dramatically reduced for the memory cells, such that the mask ROM is programmed during fabrication while a few failed mask ROM cells are replaced with OTP memory cells after fabrication. Thus, programming the OTP memory cells are relatively short. And the replaced memory cells have same configuration of memory cell structure and same read path, such as, local sense amp and global sense amp, where the OTP memory cells are placed in the middle and the edge of the mask ROM cells. And OTP memory cells are used anti-fuse circuit for storing the repair information as well (not shown).

For reading the stored data, the word line 211 is asserted to high, so that the local bit line 221 is raised to higher than VT voltage (threshold voltage) when storing data "1" because the capacitor is shorted to the plate line at VDD (supply) voltage. Otherwise, the local bit line keeps a pre-charge state at VSS voltage when storing data "0" because the capacitor is not shorted. In order to realize fast read operation, the local bit line is multi-divided, such that length of the local bit line is shorter than that of conventional circuit. For instance, bit line loading is half, one-fourth or one-eighth, compared with the conventional memory. However, by dividing the local bit line into short lines, more sense amps are required. Thus, each local sense amp is configured with four transistors for inserting between the divided memory arrays, wherein the local sense amp is composed of a pre-charge transistor 222 for pre-charging the local bit line 221, a write transistor 225 for writing data, a local amplify transistor 223 for reading the local bit line 221, and an amplify enable transistor 224 for enabling the local amplify transistor 223. In this manner, multi-stage sense amps are used for reading the memory cell, such that multiple local sense amps are connected to the write circuit 230 and the read circuit 250 for configuring high density memory.

Figure 7A:
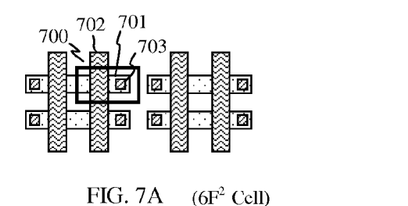
FIGS. 7A, 7B, 7C, 7D and 7E illustrate example memory cell layout for the mask ROM.
Figure 7B:
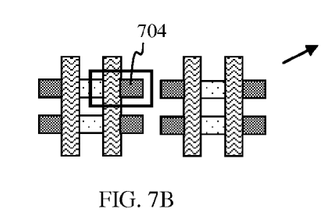
Figure 7C:
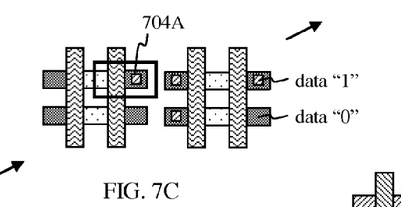

For programming the mask ROM cell, the capacitor is shorted by defining an additional contact mask (as shown 704A in FIG. 7C). Otherwise, the capacitor is remained at floating state, which charges near VSS (ground) voltage with sub-threshold leakage current of the pass transistor 212, because the sub-threshold leakage current is higher than leakage current through the capacitor generally. In doing so, the mask ROM cells are programmed during fabrication, which reduces programming time. However, programmed cells are never re-programmed until contact mask is changed. And failed mask ROM cells can not be replaced with other spare mask ROM cells, because spare cells can not be programmed. Hence, laser fuse and electric fuse can be used as redundancy cells for repairing the failed mask ROM cells. However, area is big and access path is different from the mask ROM cells with conventional repairing scheme.

In order to replace the failed mask ROM cells, the OTP memory cells are placed in the middle or the edge of the mask ROM arrays. For example, the memory cell 210 in the memory block 200 is used as the OTP memory cell, where the main mask ROM cells are placed in the memory block 297 and 298. As the structure of the OTP memory cell is the same as the mask ROM, the memory cell 210 as an OTP memory cell includes a capacitor including a lower plate, an insulation layer and an upper plate, where the insulation layer is not etched. Thereby, the insulation layer can be blown by over-stressing during program, where the programming method is same as conventional OTP memory. More specifically, the write circuit 230 is composed of a receiving gate 233, a pre-set transistor 232 and a write buffer, wherein receiving gate 233 receives a write data 201 through an inverting gate 204 which is connected to a forwarding write line 203 connecting to an inverting buffer 202, a pre-set transistor 232 pre-sets the write bit line 231, and the write buffer which includes a program inhibit transistor 234, a program disable transistor 235, a program enable transistor 236, and a feedback transistor 237. And the feedback transistor 237 is connected to a program execute transistor 238, a fixed pull-down transistor 239 and a controllable pull-down transistor 239A for adjusting pull-down strength. The receiving gate 233 controls an inverter 233A which controls the program execute transistor 238 and the program inhibit transistor 234. And the read circuit 250 is composed of a tri-state inverter 264, a read inverter 256 and a common source amplifier, wherein the common source amplifier includes a pre-set transistor 252 for pre-setting a read bit line 251, a block amplify transistor 253, a block select transistor 254, additional select transistor 254A (for programming), and active load transistors 266, 267, 268 and 269. When the memory block 200 is selected, the common source amplifier is activated by enabling the block select transistor 254 (during read operation) and active load transistors 266, 267, 268 and 269. But the tri-state inverter 264 is disabled for the selected memory block by block select signals 261A (high) and 261B (low), while other tri-state inverter 271 in unselected memory block 270 is enabled to bypass a read output 257 of the read inverter 256. And data input 203 of the tri-state inverter 264 keeps high for preventing a conflict during standby.

When writing (programming) the OTP memory cell, the local sense amp 220 serves as a detector circuit which detects the local bit line voltage 221, because the local bit line is raised by a current path at least higher than threshold voltage of MOS transistor, wherein the current path is set up from the plate line 214 of the capacitor to the feedback transistor 237 through the write transistor 225 and the write bit line 231, when the program enable transistor 236 is turned on for writing data "1", but the pre-set transistor 232 and a program inhibit transistor 234 are turned off. Then, the local sense amp 220 amplifies the local bit line voltage, and transfers an output to the read circuit 250 through the read bit line 251. When the output from the local sense amp 220 is reached to the read circuit, the read circuit 250 generates a feedback signal 257, while the block amplify transistor 253 pulls up a common node 255 when the block select transistor 254 is turned on, because pull-up strength of the block amplify transistor 253 and the block select transistor 254 is much stronger than strength of the active load transistors 266, 267, 268 and 269. Hence, the feedback transistor 237 cuts off a current path through the local bit line. In this manner, the memory cells are uniformly programmed, which means that the programmed cell has equivalent resistive value. Furthermore, voltage drop of the plate line 214 is reduced. Without the current detector circuit, voltage drop is very high when programming all "1" or no voltage drop is exhibited when programming all "0", such that the plate line voltage should be increased for blowing the capacitor for all 1" programming. Otherwise, the capacitor can not be blown with under stress because the blown capacitors set up current path through the local bit line.

And the write circuit 230 and the read circuit 250 configures a global sense amp, wherein the global sense amp is connected to a buffered data path including the forwarding write line 203 and a returning read line 257, while the tri-state inverter 264 is turned off by a block select signals 261A (high) and 261B (low). By turning off the tri-state inverter 264, the buffered data path is divided into a write path and a read path. When writing (programming), the forwarding write line 203 serves as a write path, such that the receiving gate 233 in the write circuit 230 is enabled by the block select signal 261A (high) for receiving a data input from the forwarding write line 203. In doing so, the write data 201 is transferred to the memory cell through the write circuit and the local bit line. And during standby, the forwarding write line 203 keeps high while the write data 201 is low, for pre-charging the common node 255 to VSS (ground) voltage, which prevents a conflict with the active load transistors while the tri-state inverter 264 is turned on. For the main memory blocks, the write circuit 230 is not used for programming the mask ROM cells typically, because the mask ROM cells are already programmed. However, there is a rare chance to program from data "0" to data "1" for the mask ROM cells with the write circuit 230, because the insulation layer of the mask ROM cell is still useful for blowing. In doing so, minor modification is available as long as the modification is to program from data "0" to data "1".

When reading, remained portion of the buffered data path includes the returning read line 257 which serves as a read path, such that the returning read line 257 transfers the read output from the read inverter 256 which receives an output from the common source amplifier. In doing so, the read output from the read inverter 256 is transferred to an output latch circuit 280 through the returning read line 257 and inverting buffers 271, 272, 273, 274 and 275, while unselected tri-state inverter 271 in the unselected memory block 270 is turned on, in order to bypass the read output from the selected memory block 200. Furthermore, the pull-down transistor 268 is tunable with select signal 269 including wide channel devices for adjusting gain of the common source amplifier. And the tuning information for the pull-down strength is stored in a non-volatile memory, such as, laser fuse serving as shown in FIG. 6C. In contrast, when the stored data is "0", the local bit line 221 is sustained at VSS voltage because there is no current path through the capacitor which is not blown, so that the local amplify transistor 223 is in sub-threshold region. Thereby, the local amplify transistor 223 is turned off, which does not pull down the read bit line 251. Thus the segment sense amp keeps turn-off state, and the read circuit 250 keeps pre-charge state. Hence, the read output 257 is not changed, which is read data "0".

The local amplify transistor 223 is stronger than the memory cell, which transfers a voltage output to the read circuit 250. Furthermore, the sense amps need not reference bit line because the sense amps do not compare voltage or current with reference bit line, but the sense amps detect whether the local amplify transistor 223 is turned on or not by the selected memory cell through the local bit line. Or the sense amp detects whether the local amplify transistor 223 is strongly or weakly turned on by the selected memory cell. Additionally, the local amplify transistor 223 can include a low threshold MOS transistor, which achieves fast read operation. And the read circuit 250 transfers the read output to the output latch circuit 280 through the returning read path. After then, the output latch circuit determines the read output whether the transferred data is "1" or "0" with a reference signal which is generated by data "1" because data "1" is reached to the output latch circuit early while data "0" is reached later. In this manner, the configuration of the memory block is simpler than the conventional sense amplifier using differential amplifier, while the conventional sense amplifier needs wide and long channel transistors for matching input transistors and active loads in order to compensate device mismatch and process variation.

The read path includes a returning path, so that the arriving time to the output latch circuit 280 is almost same regardless of location of the selected memory cell when reading data "1", as long as the memory cell receives the address inputs from the output latch circuit side and delay time of the address inputs include similar to the read path including multiple buffers.

In the output latch circuit 280, the read output (data "1") changes the latch node 283 and output 288 to high from low through an AND gate 281 because the latch node 283 is pre-charged to low by NMOS 284 and the AND gate 281 with an inverter 289 which is controlled by latch control signal 289A. After then, the read output is stored in the latch node 283 with cross coupled inverters 285 and 286. And the output 288 changes NOR gate 291 to high, so that the transmission gate 282 is locked by signal 293 and 295 which are transferred from the output 288 through a tunable delay circuit 292 and inverter 294. Simultaneously, main output latch circuits 296 is also locked by the signal 293 and 295, where main output latch circuit 296 is composed of same circuit as the output latch circuit 280. In doing so, the output 288 serves as a reference signal, which is generated by the reference memory cells, such as the memory cell 210 which store data "1" in the storage node. Adding delay circuit 292, the reference signal serves as a locking signal, where the delay circuit is tunable for differentiating data "1" and data "0", more effectively, because data "1" is arrived earlier while data "0" is arrived later or not arrived. When reading data "0", the local sense amp is turned off or weakly turned on by the local bit line, but the read bit line 251 is slightly pulled down through the local sense amp when the local bit line 221 is coupled from pre-charged voltage at VSS voltage, but the active load transistors 266, 267 and 268 reject a weak pull-up through the block amplifying transistors 253 and 254, if the pull-down strength of the active load transistors is at least stronger than the weak inversion of the block amplify transistor 253.

Alternatively, the read inverter 256 can be a Schmidt trigger to reject low voltage more effectively, which can be composed of the conventional circuit techniques as published U.S. Pat. Nos. 4,539,489 and 6,084,456, thus detailed schematic is not described in the present invention, wherein an inverting type Schmidt trigger can be used for this application. Thus, one of two data is arrived earlier than the other data because of inversion state of the local amplify transistor 223, so that one data is referred to as fast data and the other data is referred to as slow data.

Thus, the output latch circuit 280 and the delay circuit 292 configure a latch control circuit 290, in order to generate the locking signal. More detailed delay circuit will be explained as below (in FIG. 6A). And the NOR gate 291 is used to generate a reference signal even though one of reference cells is failed, where more than one reference column is added for configuring the memory block even though the drawing illustrates only one reference memory column 200 including the output latch circuit 280. In this manner, fast data from the main memory blocks 297 and 298 are stored to the output latch circuit 290 before the locking signals 293 and 295 lock the latch, while slow data are not latched. Furthermore, the read access time is faster than that of the conventional memory, such that multi-divided bit line architecture is introduced in order to reduce the parasitic capacitance of local bit line. As a result, the sensing scheme including the locking signal is referred to as a "time-domain sensing scheme" with the multi-stage sense amps and the locking signal.

And during write (program) operation, the write transfer gate 225 in the local sense amp 220 is turned on by asserting a write control signal 225A for breaking down insulation layer of the capacitor 213 when the write data 201 is high, while the pre-charge transistor 222 and the enable (select) transistor 224 keep turn-off state. When the write data 201 is low, the capacitor 213 is not broken down with under stress even though the plate line 214 is asserted to a very high voltage VPP, for example 3V while VDD voltage for the write circuit 230 is 1.2V, because the local bit line 221 is raised near VDD voltage by the pull-up transistors 234 and 235 of the write circuit 230.

An aspect for the read and write operation is that the word line voltage affects the operation time, such that the word line for the selected memory cell is raised to higher than VDD+VT level in order to avoid NMOS threshold voltage drop, and the write control signal 225A is also raised to higher than VDD+VT level, where VT is threshold voltage. Hence the local bit line is quickly charged or discharged when reading data, which realizes fast access operation. During write operation, the word line and the write control signal also raised to higher than VDD+VT voltage to store full VDD voltage to the storage node when writing data "1", as alternative configuration. However, VDD voltage is still useful to configure with no level shifter circuits for driving the word line and the write control signal.

Figure 2B:
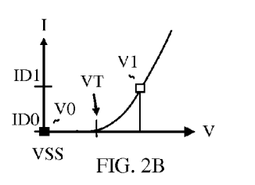
FIG. 2B illustrates an I-V curve of the local sense amp when reading.

Referring now to FIG. 2B in view of FIG. 2A, I-V curve of the local amplify transistor 223 is illustrated when reading. During standby, the local bit line voltage is pre-charged to VSS voltage. For reading the memory cell, the word line 211 is asserted to a predetermined voltage, after then the pre-charge transistor 222 is turned off, because the pre-charge transistor sweeps some remained charges in the capacitor when the memory cell 210 stores data "0" (D0 in FIG. 2B). Thus, the local bit line 221 is keeps VSS voltage because there is no current path through the capacitor which is not blown. Thereby the local amplify transistor 223 is in sub-threshold region, and the local amplify transistor 223 can only flow leakage current ID0. On the contrary, when the memory cell 210 stores data "1" (D1 in FIG. 2B), the local bit line 221 is raised near VDD voltage from VSS voltage. Thereby the local amplify transistor 223 flows a current ID1 because there is a current path through the blown capacitor to the local bit line. Hence, the local amplify transistor 223 is in saturation region.

Figure 2C:
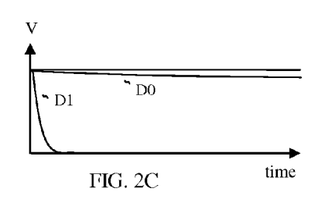
FIG. 2C illustrates discharge time of a read bit line.

Referring now to FIG. 2C in view of FIG. 2A, discharge time of the read bit line 251 is illustrated. When the storage node of the selected memory cell stores data "1", the read bit line 251 is discharged by the local amplify transistor 223 because the local bit line is raised near VDD voltage. On the contrary, the read bit line 251 keeps pre-charge state but very slowly discharged by leakage current, when reading data "0", while the local amplify transistor 223 provides sub-threshold leakage current, because the local amplify transistor 223 is turned off.

Figure 2D:
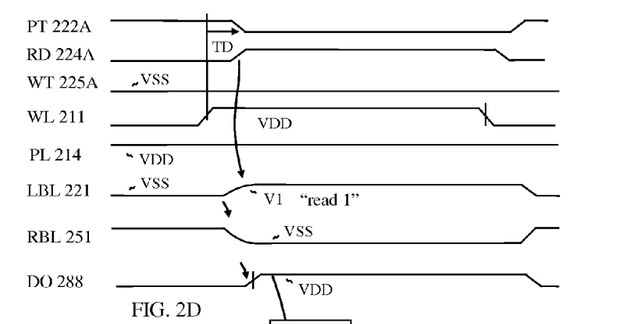
FIG. 2D illustrates a timing diagram for reading data "1"

Referring now to FIG. 2D in view of FIG. 2A, detailed timing diagram for reading data "1" is illustrated. To read data, the word line 211 is raised to a predetermined voltage, and then the pre-charge (PT) signal 222A is asserted to low. Since the capacitor is blown, the local bit line (BL) 221 is charged to VDD−VT voltage (near VDD voltage) from VSS voltage by the memory cell 210, which discharges the read bit line (RBL) 251 when the (read) enable signal 224A is asserted to high. Discharging the read bit line 251, the common node 255 of the common source amplifier is pulled up near VDD voltage by the block amplify transistor 253 while the block amplify transistor 254 is turned on, but the block pre-set transistor 252 is turned off. By pulling up the common node 255, the read inverter 256 transfers the change to output node (DO) 288 through the returning read line 257 and inverting buffers 271, 272, 273, 274 and 275. After reading data, all the control signals including the pre-charge (PT) signal 222A, the word line, and other control signals, are returned to pre-charge state or standby mode.

Figure 2E:
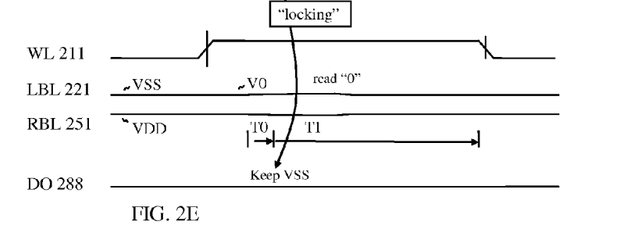
FIG. 2E illustrates a timing diagram for reading data "0"

Referring now to FIG. 2E in view of FIG. 2A, detailed read timing diagram for reading data "0" is illustrated, wherein the local bit line (BL) 221 is sustained near VSS voltage, because un-blown capacitor does not pull up the local bit line. Furthermore, remained charges in the capacitor are swept by the pre-charge transistor during overlapping time (TD, shown in FIG. 2D) between the word line 211 and the pre-charge control signal 222A, while the plate line (PL) 214 keeps VDD voltage during read operation. More specifically, the overlapping time is relatively short, but the remained charges in the un-blown capacitor 213 are recombined with charges in the local bit line 221, such that the local bit line voltage is still near VSS voltage because the charges in the capacitor is much less than the charges in the local bit line. While the local bit line keeps VSS voltage, the local amplify transistor 223 is in sub-threshold region. Thereby, the read bit line 251 keeps pre-charge state. And the common node 255 also keeps pre-charge state with weak pull-down transistors 266, 267 and 268, thus the output (DO) 288 keeps low. However, the read bit line (RBL) 251 is very slowly discharged by the turn-off current through the local sense amp, while the local bit line 221 is near VSS voltage. The leakage current depends on transistor parameters, temperature and substrate voltage for the NMOS transistors. Hence, the read bit line 251 may be gradually pulled down, which may change the read inverter 256 through the sense amps. In order to avoid the false flip with the leakage current, the pull-down strength of active load transistors 266, 267 and 268 can be adjusted by selecting the transistors 269. After reading data "0", all the control signals including the pre-charge (PT) signal 222A, the word line, and other control signals, are returned to pre-charge state or standby mode. And, the locking signal 293 and 295 based on fast data (data "1") effectively rejects latching slow data, such that the reference signal is generated by fast data (data "1") with delay time as shown T0, so that the timing margin T1 is defined to reject slow data (data "0").

In this manner, the time-domain sensing scheme can differentiate the stored data in the capacitor within a predetermined time domain. Thereby, data "1" is quickly reached to the output latch circuit, which generates a locking signal, but data "0" is very slowly transferred, thus the locking signal effectively rejects data "0" to be latched to the output latch circuit. In other words, fast cycle memory (with no page mode) does not require the locking signal which is generated by the reference signal based on reference cells storing data "1", because data "0" is not reached to the output latch circuit within a short cycle. Thus, an enable signal from a control circuit (not shown) is used to control the output latch circuit, which does not require reference cells and related circuits. And by applying multi-divided bit line architecture, fast read operation and write operation are realized. And there are various modifications and alternatives for configuring the multi-stage sense amps, in order to read data from the memory cell through the multi-divided bit line.

Figure 2F:
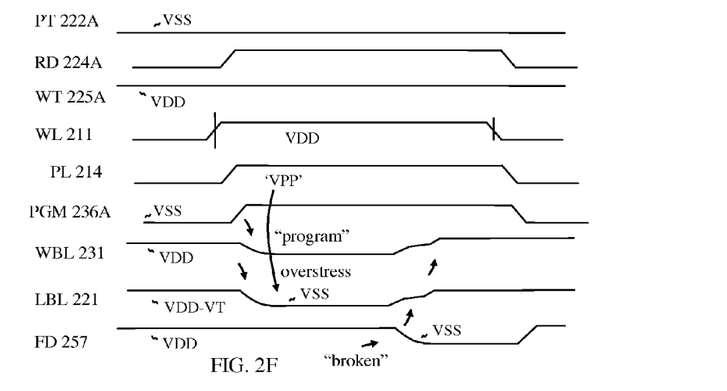
FIG. 2F illustrates a timing diagram for writing (program) data "1"

Referring now to FIG. 2F in view of FIG. 2A, detailed timing diagram for writing (programming) data "1" is illustrated. For programming the OTP memory cell, the word line 211 is asserted to high at first while pre-charge control signal 222A keeps low. Hence, the storage node of the capacitor 213 is charged to VDD−VT voltage through the NMOS pass transistor 212 and the write transistor 225 with threshold voltage drop because the pre-set transistor 232 in the write circuit 230 is still turned on, which pre-sets the write bit line 231 to high (VDD voltage). At the same time, the plate line 214 is asserted to VPP voltage. After then the pre-set transistor 232 in the write circuit 230 is turned off, and the program enable transistor 236 is turned on by asserting the program start signal 236A, so that the write bit line 231 is discharged to VSS voltage through the feedback transistor 237, the program execute transistor 238 and pull-down transistors 239 and 239A because the NAND gate 233 generates low output and the inverter 233A generates high output for turning on the program execute transistor 238. By discharging the write bit line, the storage node of the capacitor is discharged to VSS voltage with no voltage drop, which makes to overstress to the capacitor with high voltage plate line 214 (VPP voltage). By the overstress, the capacitor is broken down within a given time. After blown, a current path is set up from the plate line 214 to ground node through the write bit line 231. By the current path, the local bit line 221 is raised from VSS voltage. When the local bit line is raised to threshold voltage of the local amplify transistor 223, the read bit line 251 is discharged by the local amplify transistor 223 while the amplify enable transistor 224 is turned on to measure the local bit line voltage after blown. Thus, the read output 257 of the read inverter 256 is changed to low because the common node 255 is raised near VDD voltage by the block amplify transistor 253 and the additional select transistor 254A receiving an out of NAND gate 233, while the read bit line 251 is lowered to VSS voltage and the block select transistor 254 is turned off (during program). And the pre-set transistor 252 is turned off. In doing so, the current path after blown is cut off by the feedback transistor 237, which realizes the blown capacitor to have more uniform resistance value, and also reduces programming current. During program, the strong pull-down transistor 239A is turned on for increasing the current flow, while the weak pull-down transistor 239 is always turned on. And more transistors can be added for adjusting the strength of the current flow, where the adjusting information is stored in a nonvolatile memory, such as, laser fuse, electric fuse and same one-time programmable memory.

Figure 2G:
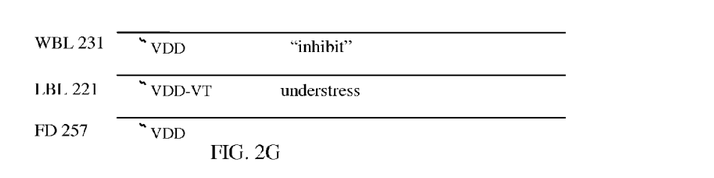
FIG. 2G illustrates a timing diagram for writing (inhibit) data "0", according to the teachings of the present invention.

Referring now to FIG. 2G in view of FIG. 2A, detailed timing diagram for writing data "0" is illustrated, wherein the capacitor 213 is not blown because the local bit line 221 is not discharge to VSS voltage through the write bit line 231. Even though the program enable transistor 236 is turned on by asserting the program start signal 236A, the write bit line 231 is not discharged to VSS voltage. Instead, the program inhibit transistor 234 is turned on while the program disable transistor 235 is turned on, because the inverting gate 233A generates low output for turning on the program inhibit transistor 234, and which turns off the program execute transistor 238.

Figure 3:
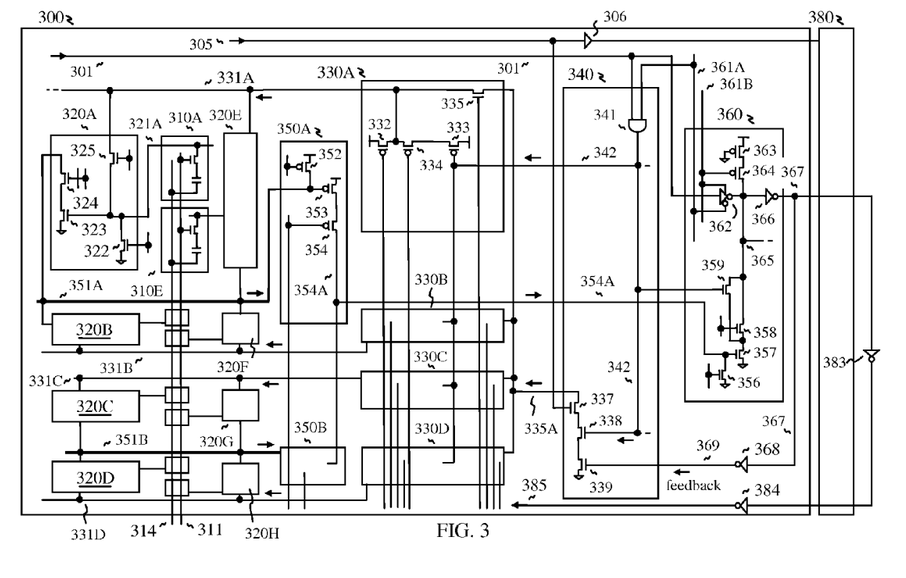
FIG. 3 illustrates a decoding scheme for the mask ROM with light bit line architecture, according to the teachings of the present invention.

In FIG. 3, a decoding scheme for the mask ROM with light bit line architecture is illustrated, wherein a memory block 300 comprises left local sense amps 320A, 320B, 320C and 320D, right local sense amp 320E, 320F, 320G, and 320H, a global sense amp including segment sense amps 350A and 350B, a read circuit 360, and a write circuit including write set-up circuits 330A, 330B, 330C and 330D including a pull-up portion and a bypass portion, and a write execute circuit 340 including a pull-down portion, wherein the write inhibit circuits and the write execute circuit configure a write buffer. More detailed operation will be explained as below. The memory cell 310A is connected to the left local sense amp 320A, another memory cell 310E is connected to the right local sense amp 320E, and other (unnumbered) memory cells are connected to local sense amps, respectively. The memory cells are connected to a word line 311 and a plate line 314.

And adjacent memory block 380 is composed of the same circuit as the memory block 300.

The read path is established from one of memory cell to data output node 385 through one of local sense amps, one of segment sense amps, and the read circuit, such that the local sense amps 320A, 320B, 320E and 320F are connected to the segment sense amp 350A through a segment read line 351A, and the local sense amps 320C, 320D, 320G and 320H are connected to the segment sense amp 350B through a segment read line 351B, in order to reduce number of segment read lines.

For implementing one-of-eight column decoding, eight memory cells are activated by the word line 311, and eight local sense amps are connected to the local sense amps respectively. For example, the local amplify transistor 323 of the local sense amp 320A reads the memory cell 310A through a local bit line 321A when the select transistor 324 is turned on, while the pre-charge transistor 322 and the write transistor 325 are turned off, and then the read output from the memory cell is transferred to the segment sense amp 350A through the segment read line 351A, but local sense amps 320B, 320E and 320F are not selected, because the select transistor of the local sense amp 320B, 320E and 320F keep low. Hence, two different select signals decode the left local sense amps for decoding the select transistor 324, and two more select signals decode the right local sense amps (not shown). Similarly, local sense amp 320C reads one of memory cells, and the read output from the memory cell is transferred to the segment sense amp 350B through another segment read line 351B, when the select transistor is turned on, but local sense amps 320D, 320G and 320H are not selected.

After then, one of two segment sense amps 350A and 350B is selected by segment select signal, such that the segment sense amp 350A is selected by a segment select transistor 354 and a current path is set up through the segment amplify transistor 353 when the reset transistor 352 is turned off. As a result, only one read output is transferred to the common node 365 through amplifying portion of a common source amplifier and the global read line 354A, so that the common node 365 is pulled down by the amplify transistor 357 when the block select transistor 358 is turned on, but the pre-set transistor 356 is turned off where active load transistors 363 and 364 are much weaker than the pull-down transistors 357 and 358. And the read output is transferred to data output node 385 through inverting buffers 383 and 384, while a tri-state inverter 362 in the selected memory block 300 is turned off by block select signals 361A (high) and 361B (low) but other tri-state inverter in unselected memory block 380 (not shown) is turned on, in order to bypass the read output.

For writing (programming) data, eight memory cells are turned on by asserting the word line 311 while the local bit lines are raised near VDD voltage through the write transistors, and the write bit lines 331A, 331B, 331C and 331D are pre-set by the pre-set transistor 332 in the write set-up circuits 330A, 330B, 330C and 330D. In doing so, the storage node of the capacitor is pre-set to VDD−VT voltage, which reduces voltage stress for unselected memory cells. Then, the selected memory cell 310A, for example, is overstressed by lowering to VSS voltage through the selected local bit line 321A while the write transistor 325 keeps turn-on state, but adjacent memory cell 310E is not overstressed by turning off the write transistor in the local sense amp 320E. And other memory cells are not overstressed by turning off the write transistor, either. And then the plate line 314 is raised to VPP voltage, as explained above. For the selected memory cell 310A, the storage node of the capacitor is discharged to VSS voltage, through pull-down current path including column select transistor 335 in the write set-up portion 330A, another column select transistor 337, program execute transistor 338 and a feedback transistor 339 in the a write execute circuit (pull-down portion) 340, wherein the program execute transistor 338 receives a program data 342 from the receiving gate 341. After the capacitor is blown, the feedback transistor 339 is turned off by a buffered read output 369 which is generated by an inverter 368 through the read output 367 of the read inverter 366, when the block amplify transistor 357 is turned on by the global read line 354A because the read bit line 351A is lowered by the local sense amp and the global read line 354A is raised by the segment sense amp 350A, while the additional select transistor 359 is turned on, during program. But the block select transistor 358 and the tri-state inverter 362 are turned off, where the block select transistor 358 is used for read operation only. For implementing one of eight column-decoding during program, the write transistor 325 in the local sense amp 320A is selected, and the column select transistor 335 in the write set-up portion 330A is selected, while other seven columns are not selected. For writing (program inhibit) data "0", the write data 301 is asserted to low, which turns off the program execute transistor 338 in the pull-down portion 340, but the program inhibit transistor 333 in the write set-up portion 330A is turned on while the program disable transistor 334 is turned on, so that the storage node of the capacitor is not discharged by the write bit line 331B with no current path.

In order to realize more flexible column decoding, another column select signal (page select signal) 305 is used for decoding in the same direction as the local bit line, so that the column select transistor 337 in the pull-down portion 340 is enabled, when the column select signal 305 is asserted to high. And the page select signal 305 is buffered by a buffer circuit 306 for next memory block. Similarly, the receiving gate 341 can receive for additional write decoding, such that 3-input NAND can be used (not shown) for implementing the circuit.

Figure 4:
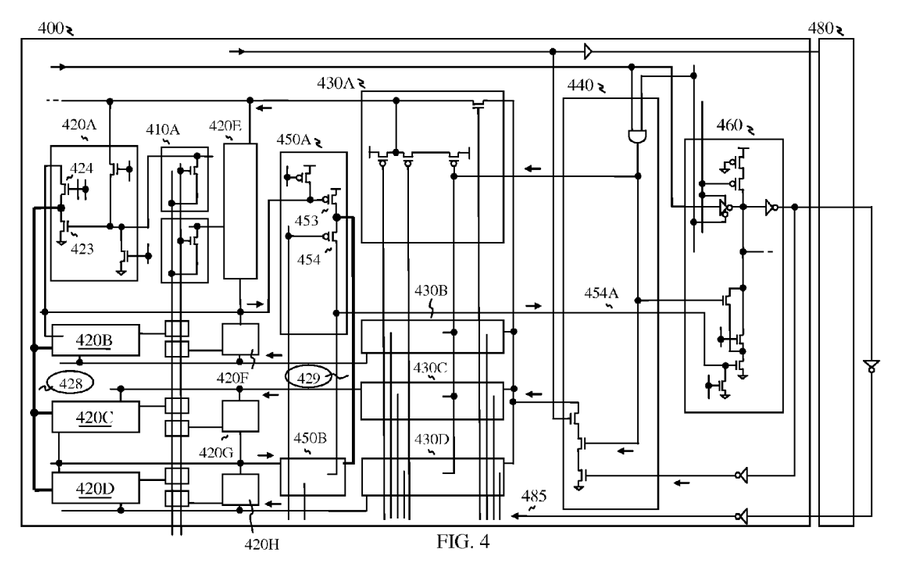
FIG. 4 illustrates alternative decoding scheme for reference memory cells of the mask ROM, according to the teachings of the present invention.

In FIG. 4, alternative decoding scheme for the mask ROM with light bit line architecture is illustrated, wherein the circuit configuration is similar to FIG. 3, except the read path for generating an output 485, because the reference signal should work for realizing the time domain sensing scheme, even though there are a few failed reference cells, where the memory block 400 and 480 serve as reference memory blocks. In this manner, the output 485 is used as a reference signal for generating the locking signal as explained above in FIG. 2A. For realizing a reference signal generator more effectively, memory cell 410A is shorted to the plate line with no capacitor. Thus, there is no need to program, but the reference memory cell can be failed very rarely as well, because the reference memory cell is tighter than other circuits typically for integrating more memory cells in a chip, while main memory cells can be replaced with redundant memory cells and repair circuits (not shown) in general. The reference cell can also be replaced, but this alternative decoding scheme can eliminate the repair circuit for the reference cell because the reference cell always stores data "1".

In order to generate the reference signal as long as one of four memory cells (connecting to left local sense amps or right local sense amps) works correctly, column select transistor 424 in the local sense amp 420A is bypassed because one of select transistors is turned on during read cycle, such that drain region 428 (circled in the left of the drawing) of the local amplify transistors 423 is connected and merged to other local sense amps. Thus, at least one output of the local sense amps 420A, 420B, 420C and 420D is transferred to segment sense amps 450A and 450B, as long as one of four memory cells works correctly. Similarly, another drain region 429 (circled around middle of the drawing) of the segment amplify transistors 453 is connected and merged for bypassing select transistor, so that the output 454A of the segment sense amps 450A and 450B is transferred to the output node 485 through the read circuit 460 and buffers, while the other circuit configuration is similar to FIG. 3, such that the memory block 400 comprises left local sense amps 420A, 420B, 420C and 420D, right local sense amp 420E, 420F, 420G, and 420H, the segment sense amps 450A and 450B, the read circuit 460, and the write circuit including write set-up circuits 430A, 430B, 430C and 430D, and the write execute circuit 440. As a result, the output 485 serves as the reference signal for generating the locking signal.

Figure 5:
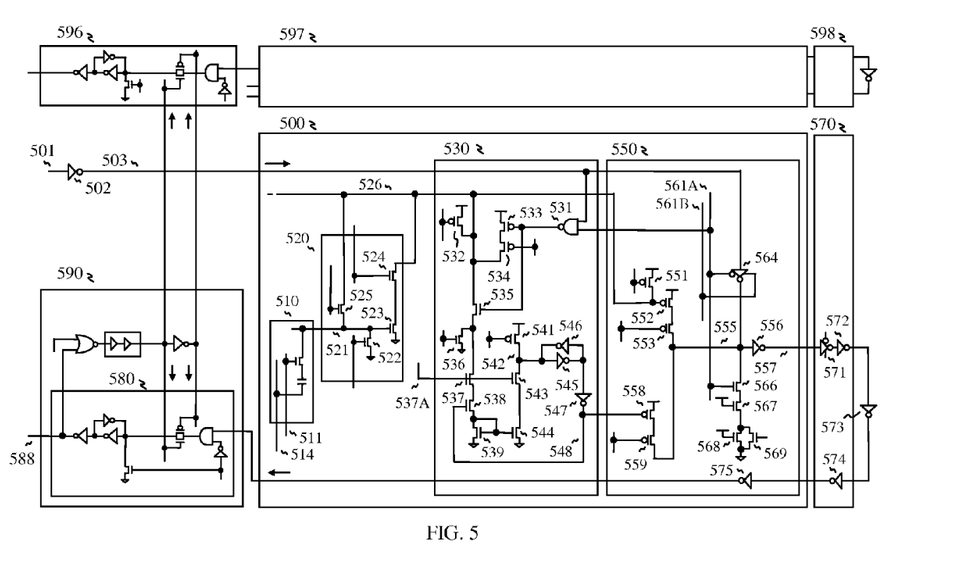
FIG. 5 illustrates alternative configuration including a current mirror as a current detector circuit, according to the teachings of the present invention.

In FIG. 5, alternative configuration using a current minor as a current detector circuit, wherein a write circuit 530 comprises a current repeater circuit including a pull-down transistor 539 for sinking current from the local bit line through a feedback transistor 538 and a current repeat transistor 544. The memory block 500 comprises memory cell 510, a local sense amp 520, the write circuit 530, and a read circuit 550. A word line 511 and a plate line 514 are connected to the memory cell 510. And the memory cell 510 is connected to the local sense amp 520 through a local bit line 521 for reading data. A (shared) global bit line 526 is connected to the memory cell 510 for writing and reading data, such that the capacitor is blown for storing data "1", otherwise the capacitor is not blown for storing data "0".

For writing (programming) data "1", the word line 511 is asserted to high first while pre-charge control signal 522A keeps low. Hence, the storage node of the memory cell 510 is charged to VDD−VT voltage through the write transistor 525 with threshold voltage drop because the pre-set transistor 532 in the write circuit 530 is still turned on, which pre-sets the global bit line 526 to high (VDD voltage). At the same time, the plate line 514 is asserted to VPP voltage. After then, the program start transistor 536 is turned on, so that the global bit line 526 is discharged to VSS voltage through the feedback transistor 538, the program execute transistor 535 and pull-down transistors 539, because the NAND gate 531 generates high output for turning on the program execute transistor 535, when the write data 501 (high) is transferred to NAND gate 531 through inverting buffer 502 and forwarding write line 503. By discharging the global bit line 526, the storage node of the capacitor is discharged to VSS voltage with no voltage drop, which makes to overstress to the capacitor with VPP voltage. Then, the program start transistor 536 is turned off, for measuring current through the current repeat transistor 544.

Thus, the capacitor is broken down by oxide overstress, within a given time. After blown, a current path is set up from the plate line 514 to ground node. By the current path, gate of the pull-down transistor 539 is raised. When the gate of the pull-down transistor 539 is raised to threshold voltage, the current repeater transistor 544 repeats the amount of current of the current path through the program execute transistor 535, column select transistor 537, the feedback transistor 538 and the pull-down transistor 539. Hence, a pre-charged node 542 which was pre-charge to VDD voltage by a pre-charge transistor 541, is pulled down to VSS node while column select transistor 543 is turned on but the pre-charge transistor 541 is turned off, because the pull-down strength of the current repeater transistor 544 is much stronger than that of feedback inverter 546. After then, the change is stored a cross coupled inverter latch including inverter 545 and the feedback inverter 546. Simultaneously, the change is transferred to the feedback transistor 538 through a feedback output 548 of inverting buffer 547, which cuts off the current path after blown the capacitor. Thus, the blown memory cell has more uniform resistance value, and also programming current is reduced with the feedback circuit.

Otherwise, when programming data "0", the global bit line 526 keeps VDD voltage while the program inhibit transistor 533 and the program disable transistor 534 are turned on, but the program execute transistor 535 keeps turn-off state with low output of NAND gate 531, because the write data 501 keeps low state during programming data "0". Thereby, the feedback circuit does not work for programming data "0". But while programming data "1", the feedback output 548 is transferred to the read circuit 550, such that an amplify transistor 558 receives the feedback output 548 while an enable transistor 559 is turned on, because the enable transistor 559 is used for program operation only. When the feedback circuit is changed, the common node 555 is pulled up, and its change is transferred to output node 588 through inverting buffers and output latch circuit 580, while the tri-state inverter 564 is turned off, and active load transistors 566, 567, 568 and 569 are much weaker than the pull-up transistors including 558 and 559, and read enable transistor 553 is turned off during write operation, while amplifying portion including the pre-set transistor 551, the block amplify transistor 552 and the read enable transistor 553 are used for read operation only.

Read operation is similar to that of FIG. 2A as explained above. When reading data "1", the local bit line 521 is raised to higher than threshold voltage of the local amplify transistor 523, while the pre-charge transistor 522 is turned off. By raising the local bit line, the local amplify transistor 523 discharges the global bit line 526 while the write circuit 530 is disabled, so that the block amplify transistor 552 pulls up the common node 555 near VDD voltage through the block select transistor 553, because the pull-up strength is much stronger than that of active load transistors including 567, 568, 568 and 569. By raising the common node 555, the read inverter 556 changes its output from high to low, and the change is transferred to the output node 588 through the output latch circuit 580 and inverting buffers 571, 572, 573, 574 and 575, when the tri-state inverter 564 in the select memory block 500 is turned off by block select signals 561A (high) and 561B (low). And the block select signals enable the receiving gate 531 and active load transistor 566. Thereby the data output 588 serves as a reference signal for generating a locking signal for rejecting data "0" from main memory blocks 597 and 598 to main output latch circuit 596.

Alternatively, the memory cell 510 includes a resistor (not shown) and the pass transistor as a reference memory cell for generating the locking signal, because the storage node is connected to the resistor instead of the capacitor. With no capacitor, there is no write operation for the reference cell, but the resistor should be bigger than the blown capacitor as a good reference cell.

Figure 6A:
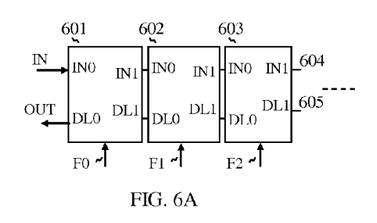
FIG. 6A illustrates a tunable delay circuit.
Figure 6B:
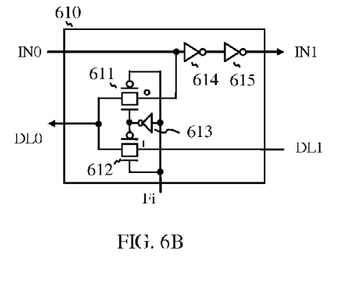
FIG. 6B illustrates a delay unit of the tunable delay circuit.
Figure 6C:
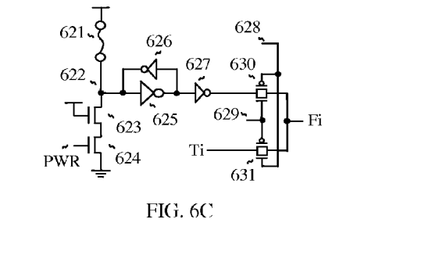
FIG. 6C illustrates a related fuse circuit of the tunable delay circuit, according to the teachings of the present invention.

In FIG. 6A, more detailed a tunable delay circuit (as shown 292 in FIG. 2A) is illustrated, wherein multiple delay units 601, 602 and 603 are connected in series, the first delay unit 601 receives input IN and generates output OUT, the second delay unit 602 is connected to the first delay unit, and the third delay unit 603 is connected to the second delay unit 602 and generates outputs 604 and 605, and so on. Each delay unit receives a fuse signal, such that the first delay unit receives F0, the second delay unit receives F1, and the third delay unit receives F2. And more detailed delay unit is illustrated in FIG. 6B, wherein the delay unit 610 receives an input IN0 and a fuse signal Fi, thus the fuse signal Fi selects output from the input IN0 or input DL1, so that a transfer gate 611 is turned on when the fuse signal Fi is low and output of inverter 613 is high, otherwise another transfer gate 612 is turned on when the fuse signal Fi is high and output of inverter 613 is low to bypass DL1 signal. Inverter chain 614 and 615 delays IN0 signal for the next delay unit, where more inverter chains or capacitors can be added for the delay even though the drawing illustrates only two inverters.

In FIG. 6C, a related fuse circuit of the tunable delay circuit (as shown in FIG. 6A) is illustrated in order to store information for the delay circuit, so that a fuse serves as a nonvolatile memory, wherein a fuse 621 is connected to a latch node 622, a cross coupled latch including two inverters 625 and 626 are connected to the latch node 622, pull-down transistors 623 and 624 are serially connected to the latch node 622 for power-up reset. Transfer gate 630 is selected by a select signal 629 (high) and another select signal 628 (low) in order to bypass the latch node voltage 622 through inverter 625 and 627. In doing so, fuse data is transferred to output node Fi, otherwise test input Ti is transferred to Fi when a transmission gate 631 is turned on.

Methods of Fabrication

The memory cells can be formed from single crystal silicon on a wafer. Alternatively, the memory cells can be formed from thin-film polysilicon layer within the current CMOS process environment. Furthermore, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used, as published, U.S. Pat. No. 5,395,804, U.S. Pat. No. 6,852,577 and U.S. Pat. No. 6,951,793. The LTPS has been developed for the low temperature process (around 500 centigrade) on the glass in order to apply the display panel. Now the LTPS can be also used as a thin film polysilicon transistor for the memory device on the wafer. The thin film based transistor can drive multi-divided bit line which is lightly loaded, even though thin film polysilicon transistor can flow less current than single crystal silicon based transistor on the surface of the wafer, for example, around 10 times weaker than that of conventional transistor, as published, "Poly-Si Thin-Film Transistors An Efficient and Low-Cost Option for Digital Operation", IEEE Transactions on Electron Devices, Vol. 54, No. 11, Nov. 2007, and "A Novel Blocking Technology for Improving the Short-Channel Effects in Polycrystalline Silicon TFT Devices", IEEE Transactions on Electron Devices, Vol. 54, No. 12, Dec. 2007. During LTPS process, the MOS transistor in the control circuit and routing metal are not degraded. And the steps in the process flow should be compatible with the current CMOS manufacturing environment for forming conventional mask ROM and OTP memory, such as U.S. Pat. No. 5,606,193 and No. 5,675,547. And forming the thin film transistor is similar to forming TFT (thin film transistor) SRAM, as published, "A 256 Mb Synchronous-Burst DDR SRAM with Hierarchical Bit-Line Architecture for Mobile Applications", IEEE International Solid-State Conference, pp 476-477, 2005, and U.S. Pat. No. 6,670,642. In this respect, detailed manufacturing processes for forming the memory cell, such as width, length, thickness, temperature, forming method, or any other material related data, are not described in the present invention.

Figure 7D:
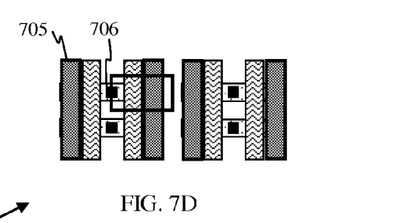
Figure 7E:
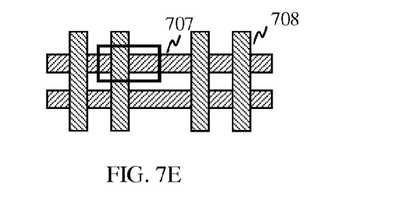

In FIGS. 7A, 7B, 7C, 7D and 7E, example layout for configuring a memory cell array is illustrated. A solid line 700 depicts a memory cell. In the process steps, active region 701 is formed first, and gate oxide (not shown) is formed on the active region, then gate region 702 is formed on the gate oxide region. After then, contact region 703 is formed as shown in FIG. 7A, in order to connect the active region to the storage element. And FIG. 7B shows a conduction layer 704 which is used as a lower plate of the capacitor. In FIG. 7C, additional contact mask is illustrated in order to program the capacitor as a storage element, wherein the contact mask 704A is defined for connecting the lower plate 704 to an upper plate 705 (shown in FIG. 7D), otherwise the capacitor is not connected to the upper plate because insulation layer is formed on the lower plate 704 (not shown). In FIG. 7D, the upper plate 705 of the capacitor as a storage element, where the gate region 702 is illustrated and a contact region 706 is defined for connecting metal region as below. And in FIG. 7E, a first metal layer 707 serving as the local bit line is formed on the (bit line) contact region 706 (shown in FIG. 7D). And, a second metal layer 708 for global word line is formed on the first metal layer 707. In this open bit line structure, one word line is used to control a memory cell with no passing word line, which makes a straight word line in shape. Hence, open bit line structure occupies 6F.sup.2 in general, which minimizes chip area.

Figure 7F:
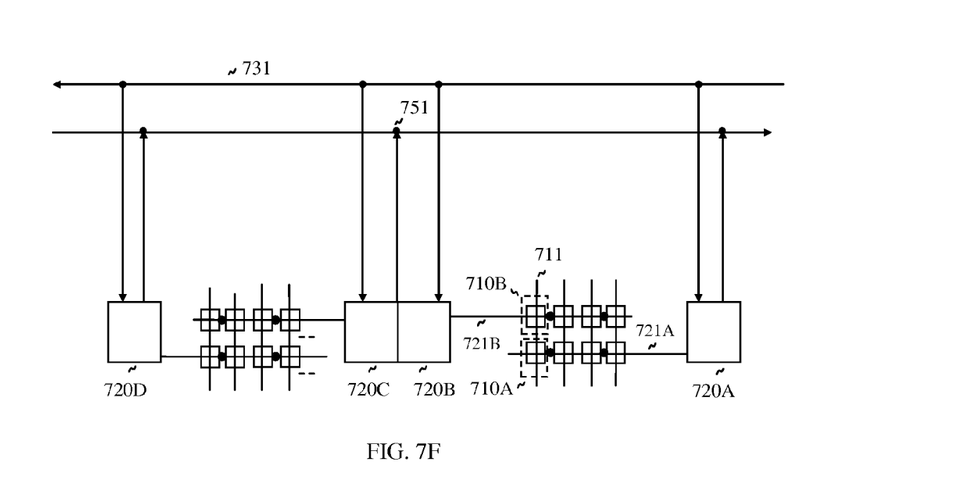
FIG. 7F illustrates block diagram for the memory cell array, according to the teachings of the present invention.

In FIG. 7F, detailed array configuration is illustrated, wherein a memory cell 710A is connected to the local bit line 721A which is also connected to the local sense amp 720A to read a data from the memory cell with a word line 711, and another memory cell 710B is connected to the local bit line 721B which is connected to the local sense amp 720B to read data with the same word line 711. When reading data, only one word line 711, for example, is asserted to a predetermined voltage. Thus, a voltage output from the memory cell 710A is transferred to the local sense amp 720A, but another output from the memory cell 720B is not selected, in order to share a read bit line 751. The other local sense amps 720C and 720D are not activated. The output of the local sense amp 720A is transferred to a read circuit (not shown). And write operation is executed by a write bit line 731 when a write transistor (225 in FIG. 2A) is turned on in the local sense amp.

Figures 8A, 8B, 8C, 8D:
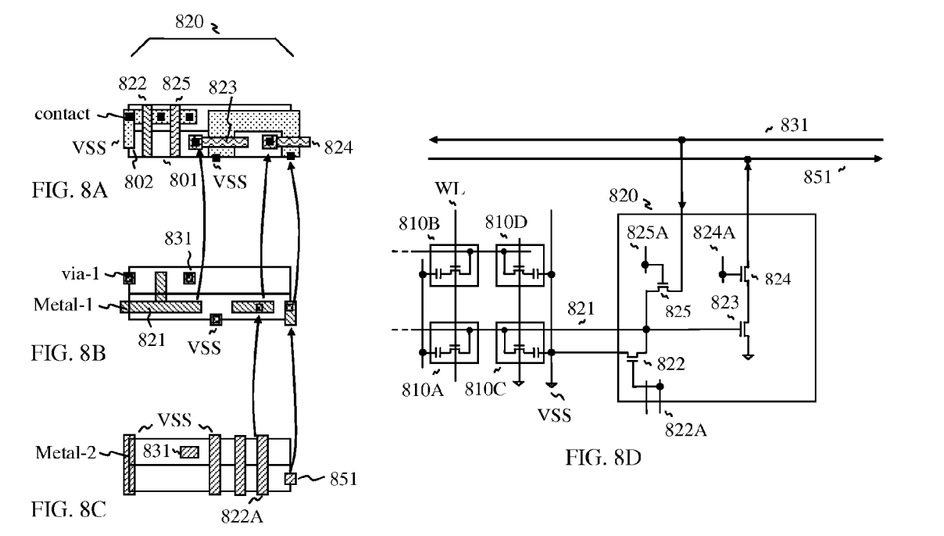
FIGS. 8A, 8B and 8C illustrate an example layout for the local sense amp.
FIG. 8D illustrates schematic for related local sense amp, according to the teachings of the present invention.

In FIGS. 8A to 8C, an example layout for the local sense amp is illustrated, wherein the local sense amp 820 (220 in FIG. 2A) is placed next to memory cell (not shown). The local sense amp 820 includes poly gate 822 as a pre-charge transistor, poly gate 823 as an local amplify transistor, poly gate 824 as a select transistor, poly gate 825 as write transfer transistors. And poly gates configure transistors 822, 823, 824, and 825 which are composed of n-type active region 802 on p-sub region 801. And metal-1 region and via-1 region are defined as shown in FIG. 8B, such that metal-1 local bit line 821 is connected to drain region of the pre-charge transistor 822 and gate region of the local amplify transistor 823 in FIG. 8A. And metal-1 831 serves as the write bit line. And in FIG. 8C, metal-2 region is defined, such that VSS voltage is provided to the pre-charge transistor. And the write bit line 831 and the read bit line 851 are defined for connecting to the related transistor and also upper layers (not shown).

In FIG. 8D, related circuit including the local sense amp 820 is illustrated for the drawings FIGS. 8A to 8C. The local sense amp 820 includes the write transfer transistors 825 which is connected to write control signal 825A, the pre-charge transistor 822 which is connected to a pre-charge control signal 822A, the local amplify transistor 823 which is connected to the local bit line 821, and the select transistor 824 which selects the local amplify transistor with control signal 824A. The memory cell 810A and 810B are connected to a word line 811 and the local sense amp 820 through the local bit line 821, and dummy cells 810C and 810D are connected to VSS voltage, where bit line contacts are shared with the main memory cell 810A and 810B, respectively, but the dummy cells are always turned off. And an output of the local sense amp 820 is connected to the write bit line 831 and the read bit line 851, where the node numbers of the circuit as shown in FIG. 8D are the same as FIGS. 8A to 8C for ease of understanding.

Figure 9A:
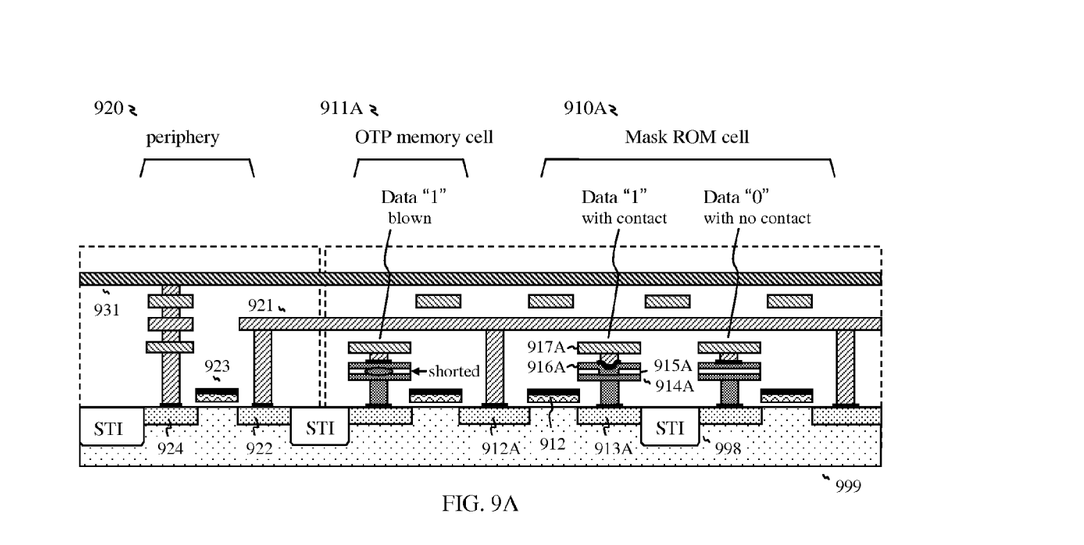
FIG. 9A illustrates an example memory cell structure for forming the mask ROM.

In FIG. 9A, an example cross sectional view including the mask ROM cell 910A and the OTP memory cell 911A is illustrated, wherein the mask ROM cell region 910A includes a capacitor which is composed of lower (bottom) plate 914A and upper (top) plate 916A on insulation layer 915A, lower plate of the capacitor is connected to a drain/source 913A of a pass gate 912, and upper plate is connected to a plate line 917A which supplies a supply voltage. For programming the mask ROM cell during fabrication, the upper plate is shorted to the lower plate with additional contact mask, so that the insulation layer 915A is etched for the connection, which stores data "1", while the insulation layer is not etched for keeping data "0" when the contact mask is not defined for storing data "0". In contrast, the OTP memory cell 911A is programmed after fabrication, such that the insulation layer of the capacitor is blown by the OTP programming method as explained above, which stores data "1", otherwise, the capacitor keeps data "0".

And a local bit line 921 is connected to a drain/source 912A of the pass gate 912. Thus memory cell data in the storage node 913A is transferred to the local bit line 921, wherein the local bit line 921 is composed of metal-1 layer. And the local bit line 921 is connected to a write transistor 923 through a drain/source region 922, where the write transistor 923 is connected to a write bit line 931 through a drain/source region 924. Hence, the peripheral circuit region 920 is placed on the same surface of a substrate 999, where the memory cell region is isolated by STI (Shallow Trench Isolation) region 998. Furthermore, various capacitors can be used as the capacitor as a storage element. For example, gate capacitor, PIP (Polysilicon Insulator Polysilicon) capacitor and MIM (Metal Insulator Metal) capacitor can be used for forming the capacitor.

Figure 9B:
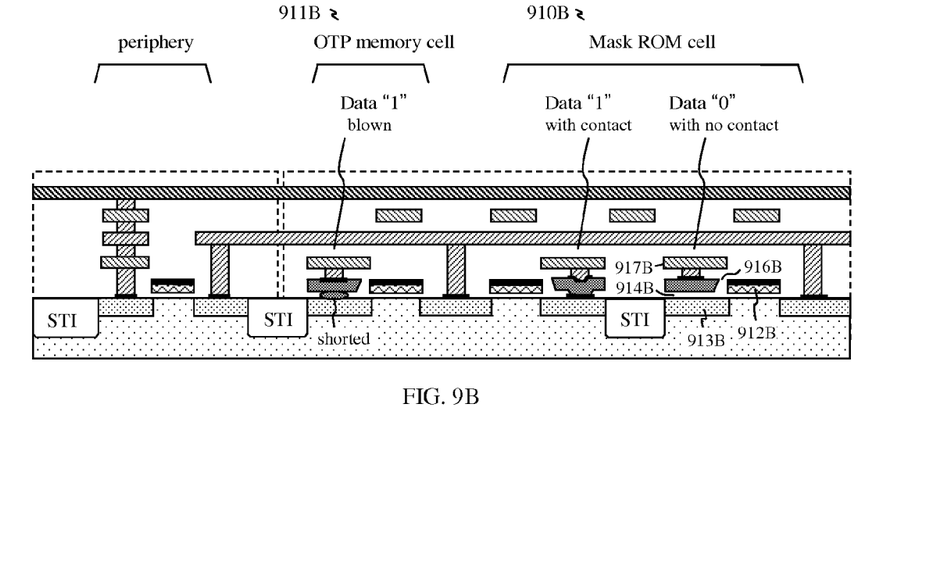
FIG. 9B illustrates alternative example memory cell structure for forming the mask ROM, according to the teachings of the present invention.

In FIG. 9B, alternative cross sectional view including the mask ROM cell 910B and the OTP memory cell 911B is illustrated, wherein the mask ROM cell region 910B includes a capacitor which is composed of lower (bottom) plate 913B serving as drain region of the pass transistor and upper (top) plate 916B on insulation layer 914B. And other regions are the same as FIG. 9A. Thereby, only upper plate region including additional contact mask (for programming) is added for implementing the mask ROM and the OTP memory. And the upper plate region 916B is formed after forming the gate region 912B of the pass transistor. The plate line 917B is connected to the upper plate region 916B for providing a supply voltage.

Figure 10A:
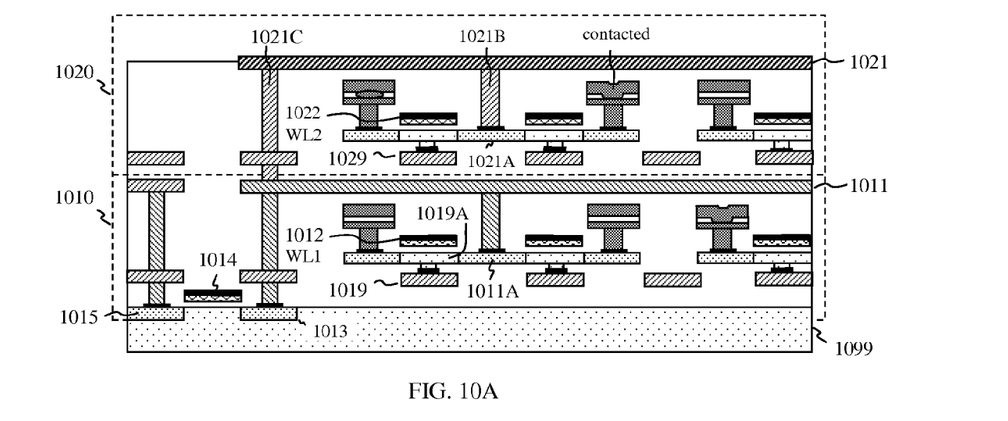
FIGS. 10A and 10B illustrate alternative memory cell structure for stacking the memory cells, according to the teachings of the present invention.

In FIG. 10A, stacked memory cell structure is illustrated as an example, wherein the programming method is the same as explained above. The memory cells in the first floor 1010 are composed of thin film layer, such that thin film N+ active layer 1011A is connected to a body 1019A which is connected to a metal bias line 1019. And the thin film N+ active layer 1011A is also connected to the write transistor 1014 through first floor bit line 1011. Memory cells in the second floor 1020 are composed of thin film layer as well, such that the thin film N+ active layer 1021A is connected to a body which is connected to metal bias line 1029. And the thin film N+ active layer 1021A is connected to drain region 1013 of the write transistor 1014 through second floor bit line 1021, contact regions 1021A (drain region), 1021B (via) and 1021C (via) in the second floor. And the write transistor 1014 is formed on a substrate 1099 with N+ active region 1013 and 1015. The first floor memory cell is controlled by a first floor word line 1012 (WL1) and the second floor memory cell is controlled by a second floor word line 1022 (WL2). As shown in the figure, the memory cells include thin film transistor as a pass transistor with body-tied structure for biasing the body, for example, VSS voltage is provided in order to reduce sub-threshold leakage current for NMOS pass transistor. And thin film layer is formed from single crystal silicon, poly crystalline silicon, silicon-germanium and germanium. Furthermore, the memory cells in the first floor and the second floor have same characteristics as long as same material and thickness are used.

Figure 10B:
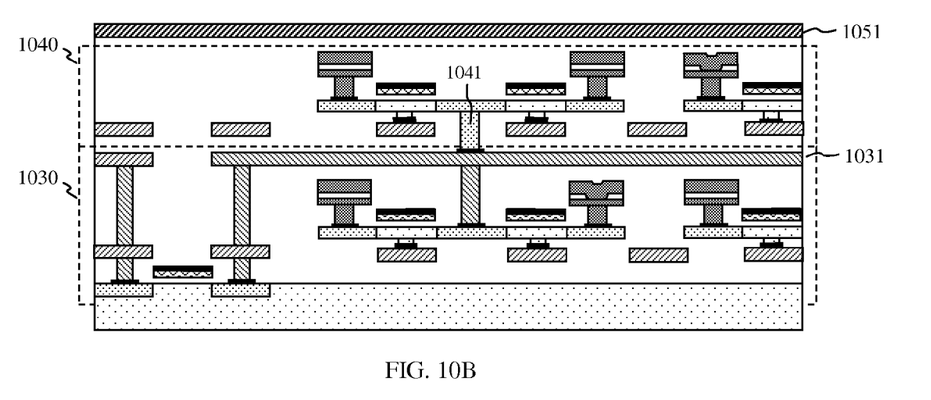

In FIG. 10B, alternative configuration with shared bit line is illustrated, wherein second floor memory cell 1040 is connected to the first bit line 1031 in the first floor memory cell 1030 through a plug 1041. Hence, the metal line 1051 can be used as a global bit line for reducing metal layers while the first floor bit line 1031 is shared. And other layers are same as those of FIG. 10A.

Figure 11:
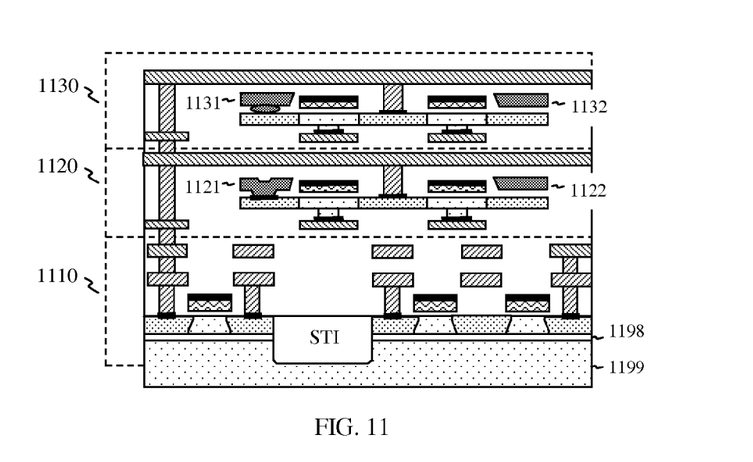
FIG. 11 illustrates alternative memory cell structure for stacking over a peripheral circuit, according to the teachings of the present invention.

In FIG. 11, alternative memory cell structure for stacking over peripheral circuit 1110 is illustrated, wherein upper plate region of the capacitor is formed after forming the gate region of the pass transistor, such that the structure is similar to FIG. 10A. And the capacitor shape is same as FIG. 9B, such that a mask ROM memory cell 1121 in the second floor 1120 stores data "1" with contact, another mask ROM memory cell 1122 in the second floor stores data "0" with no contact. And an OTP memory cell 1131 in the third floor 1130 stores data "1" after blowing, another OTP memory cell 1132 in the third floor stores data "0" with un-blown state. And the peripheral circuit 1110 can be formed on SOI (Silicon-on-Insulator) wafer 1199 where BOX (Buried oxide) region 1198 serves as an insulator.

While the descriptions here have been given for configuring the memory circuit and structure, alternative embodiments would work equally well with reverse connection such that PMOS transistor can be used as a pass transistor for configuring the memory cell, and signal polarities are also reversed to control the reverse configuration. Furthermore, the light bit line architecture is still useful for NAND type mask ROM which can be configured with series connected memory cells having implant mask coding, as published, U.S. Pat. No. 5,716,885, while the descriptions here have been described for configuring NOR type mask ROM with capacitor memory cell.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
   a memory segment including at least a memory cell and a local sense amp, wherein
      the memory cell includes a pass transistor and a capacitor as a storage element, wherein an insulation layer of the capacitor is etched or not by a contact mask during fabrication for realizing a mask ROM;
      the local sense amp is connected to the memory cell through a local bit line, wherein the local sense amp is composed of a write transistor connecting to the local bit line and a write bit line, a pre-charge transistor for pre-charging the local bit line, a local amplify transistor for reading the local bit line, an amplify enable transistor for enabling the local amplify transistor, and the amplify enable transistor is connected to a read bit line; and a buffered data path for writing and reading a stored data in the memory cell, wherein the buffered data path is divided into a forwarding write line and a returning read line by disabling a tri-state inverter in a global sense amp including a read circuit and a write circuit, wherein the read circuit is composed of the tri-state inverter for connecting to the returning read line, a common source amplifier for reading the read bit line, and a read inverter for generating a read output based on one of outputs from the tri-state inverter or the common source amplifier;

the write circuit is composed of a receiving gate for receiving the forwarding write line, a pre-set transistor for pre-setting the write bit line, and a write buffer which is controlled by the receiving gate, wherein the write buffer includes a pull-up portion for inhibiting program and a pull-down portion for executing program through the write bit line, where the pull-down portion includes a feedback transistor for cutting off a current path after the capacitor is blown when programming, and the feedback transistor receives the read output from the read inverter; and an output latch circuit receiving the read output of the read inverter as well; and a latch control circuit generating a locking signal which is generated by a reference signal based on at least a reference memory cell, in order to lock the output latch circuit.

2. The memory device of claim 1, wherein the local sense amp is composed of a pre-charge transistor for pre-charging the local bit line, a local amplify transistor for reading the local bit line, an amplify enable transistor for enabling the local amplify transistor, and the amplify enable transistor is connected to a read bit line; and the global sense amp including the read circuit with no write circuit, wherein the read circuit is composed of the tri-state inverter for connecting to the returning read line, the common source amplifier for reading the read bit line, and the read inverter for generating the read output based on one of outputs from the tri-state inverter or the common source amplifier.

3. The memory device of claim 1, wherein the write circuit includes the receiving gate, the pre-set transistor, and the write buffer, such that the write buffer includes the pull-up portion for inhibiting program and the pull-down portion for executing program, where the pull-down portion includes a current minor for measuring a current path which cuts off the current path after the capacitor is blown when programming.

4. The memory device of claim 1, wherein the read circuit is composed of the tri-state inverter, the common source amplifier and the read inverter, such that the tri-state inverter is connected to the forwarding write line, the read inverter is connected to the tri-state inverter and the common source amplifier; the common source amplifier includes a block reset transistor for resetting the read bit line, a block amplify transistor for reading the read bit line, a block enable transistor for enabling the block amplify transistor, and the block enable transistor is connected to active load transistors, where strength of the active load transistors are tunable with multiple active load transistors and at least a select transistor; and tuning information for controlling the select transistor is stored in a nonvolatile memory.

5. The memory device of claim 1, wherein the local amplify transistor of the local sense amp is composed of a low threshold MOS field effect transistor.

6. The memory device of claim 1, wherein the memory segment includes the memory cell and the local sense amp, and additionally a segment sense amp connecting to the amplify enable transistor of the local sense amp through a segment read line, wherein the local sense amp is composed of the write transistor, the pre-charge transistor, the local amplify transistor, the amplify enable transistor which is connected to the segment read line; and the segment sense amp includes a reset transistor for resetting the segment read line, a segment amplify transistor for reading the segment read line, a segment enable transistor for enabling the segment amplify transistor, and the segment enable transistor is connected to the read bit line.

7. The memory device of claim 1, wherein the latch control circuit receives a read enable signal from a control circuit and generates a locking signal to lock the output latch circuit.

8. The memory device of claim 1, wherein the latch control circuit includes a tunable delay circuit, such that the tunable delay circuit receives multiple reference signals which are generated by multiple reference memory cells; and the tunable delay circuit generates the locking signal by delaying at least one reference signal from the multiple reference signals; and tuning information for the tunable delay circuit is stored in a nonvolatile memory.

9. The memory device of claim 1, wherein the pass transistor of the memory cell is formed from single crystalline silicon.

10. The memory device of claim 1, wherein the pass transistor of the memory cell is formed from poly crystalline silicon.

11. The memory device of claim 1, wherein the pass transistor of the memory cell is formed from silicon-germanium.

12. The memory device of claim 1, wherein the pass transistor of the memory cell is formed from germanium.

13. The memory device of claim 1, wherein the pass transistor of the memory cell is formed from deposited thin film layer.

14. The memory device of claim 1, wherein the pass transistor of the memory cell is formed from a body-tied thin film transistor.

15. The memory device of claim 1, wherein the capacitor of the memory cell includes PIP (Polysilicon Insulator Polysilicon) capacitor.

16. The memory device of claim 1, wherein the capacitor of the memory cell includes MIM (Metal Insulator Metal) capacitor.

17. The memory device of claim 1, wherein the capacitor of the memory cell is formed under the pass transistor.

18. The memory device of claim 1, wherein the memory cell is stacked over peripheral circuits.

19. The memory device of claim 1, wherein the memory cell is stacked over another memory cell, where each memory cell is connected to a metal bit line.

20. The memory device of claim 1, wherein the memory cell is stacked over another memory cell, where the memory cell is connected to another memory cell through a contact region under the memory cell for sharing a metal bit line under the memory cell.

* * * * *